(12) United States Patent
Kim et al.

(10) Patent No.: US 8,492,889 B2
(45) Date of Patent: Jul. 23, 2013

(54) SEMICONDUCTOR PACKAGE (71) Applicant: SK Hynix Inc., Gyeonggi-do (KR)

(72) Inventors: Jae Myun Kim, Gyeonggi-do (KR);
Seung Jee Kim, Gyeonggi-do (KR); Ki Bum Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/756,831

(22) Filed: Feb. 1, 2013

(65) Prior Publication Data

US 2013/0147060 A1    Jun. 13, 2013

Related U.S. Application Data

(63) Continuation of application No. 12/835,921, filed on Jul. 14, 2010, now Pat. No. 8,390,114.

(30) Foreign Application Priority Data

Sep. 17, 2009  (KR) .................. 10-2009-0088040

(51) Int. Cl.
*H01L 23/34* (2006.01)
(52) U.S. Cl.
USPC ................. 257/724; 257/725; 257/E23.063; 257/E23.085

(58) Field of Classification Search
USPC ................. 257/724, 725, E23.063, E23.085
See application file for complete search history.

(56) References Cited

U.S. PATENT DOCUMENTS

| 7,989,941 | B2 * | 8/2011 | Chin et al. ................. 257/686 |
| 8,178,960 | B2 * | 5/2012 | Oh ............................. 257/686 |
| 8,324,725 | B2 * | 12/2012 | Khandros et al. ........... 257/723 |
| 8,390,114 | B2 * | 3/2013 | Kim et al. ................... 257/724 |
| 2002/0180063 | A1 * | 12/2002 | Iwaki et al. ................ 257/778 |
| 2004/0135246 | A1 * | 7/2004 | Kim et al. ................... 257/712 |
| 2004/0238935 | A1 * | 12/2004 | Yoshimura .................. 257/686 |
| 2008/0174000 | A1 * | 7/2008 | Chen et al. .................. 257/686 |
| 2010/0270689 | A1 * | 10/2010 | Kim et al. ................... 257/777 |
| 2011/0031598 | A1 * | 2/2011 | Lee et al. ..................... 257/686 |

* cited by examiner

*Primary Examiner* — Ngan Ngo
(74) *Attorney, Agent, or Firm* — Ladas & Parry LLP (57) ABSTRACT

A semiconductor package includes a substrate, a first semiconductor chip module attached to the substrate, a conductive connection member attached to the first semiconductor chip module, and a second semiconductor chip module attached to the conductive connection member. The first and second semiconductor chip modules are formed to have step like shapes to and extend laterally in opposite directions so as to define a zigzag arrangement together.

18 Claims, 5 Drawing Sheets

SEMICONDUCTOR PACKAGE

CROSS-REFERENCE TO RELATED APPLICATIONS

The present application claims priority to Korean patent application number 10-2009-0088040 filed on Sep. 17, 2009, which is incorporated herein by reference in its entirety.

BACKGROUND OF THE INVENTION

The present invention relates generally to a semiconductor package, and more particularly, to a semiconductor package having a high density and a high capacity.

In the semiconductor industry, packaging technologies for integrated circuits have continuously been developed to satisfy the demand toward miniaturization and mounting reliability. For is example, the demand toward miniaturization has expedited the development of techniques for a package with a size approaching that of a chip, and the demand toward improved mounting reliability has highlighted the importance of packaging techniques for improving the efficiency of mounting work and mechanical and electrical reliability after mounting.

As the demand for miniaturization and high performance in electric and electronic products continues, various techniques for providing a semiconductor package of high capacity have been researched and developed. A method for providing a semiconductor package of high capacity includes the high integration of a memory chip. Such high integration can be realized by integrating an increased number of cells in a limited space of a semiconductor chip.

However, the high integration of a memory chip requires high precision techniques, such as a fine line width, and a lengthy development period. Under these situations, a stacking technique has been suggested as another method for providing a semiconductor package of high capacity.

The stacking technique is includes a method of embedding to two stacked chips in one package and a method of stacking two separate packages which are independently packaged. The method of stacking two separate packages increases the thickness of the entire semiconductor package and therefore cannot accommodate the trend toward miniaturization of electric and electronic products.

Therefore, research has been actively conducted for a stack package or a multi-chip package in which two or three semiconductor chips are mounted in one package.

However, in the conventional art, metal wires are used to electrically connect a substrate and respective stacked semiconductor chips, and this leads to several problems which are detailed below.

First, when conducting a wire bonding process for the substrate and the respective semiconductor chips stacked on the substrate using the metal wires, the lengths of the metal wires increase as the number of semiconductor chips increases, and therefore, the metal wires are likely to be short-circuited due to a sweeping phenomenon of the metal wires during a molding process.

Second, as the height of the stacked semiconductor chips increases, the lengths of the metal wires increase and thus, it is difficult to properly transmit electrical signals. Further, cracks are likely to occur in the semiconductor chips due to stresses induced by wire bonding.

Third, in order to conduct wire bonding for the substrate and the respective stacked semiconductor chips on both sides of the semiconductor chips by using the metal wires, mold margins should be secured on both sides of the semiconductor chips. Due to this fact, the size of the semiconductor package is likely to increase.

BRIEF SUMMARY OF THE INVENTION

An embodiment of the present invention includes a semiconductor package which can realize a high density and a high capacity through inserting a conductive connection member for electrically connecting upper and lower semiconductor chip modules.

In an embodiment of the present invention, a semiconductor package includes a substrate; a first semiconductor chip module attached to the substrate; a conductive connection member attached to the first semiconductor chip module; and a second semiconductor chip module attached to the conductive connection member to define a zigzag arrangement together with the first semiconductor chip module.

The conductive connection member may include a conductive plate; connection members placed between the conductive plate and the first semiconductor chip module and electrically connecting them with each other; and a spacer member interposed between the conductive plate and the first semiconductor chip module.

The conductive plate may include a substrate or a tape having electrical connection patterns.

The first semiconductor chip module may include at least two first semiconductor chips stacked in a face-up type into a step-like shape and having first bonding pads which are disposed on respective step surfaces; and first connection members electrically connecting a lowermost first semiconductor chip among the first semiconductor chips with the substrate and electrically connecting the first semiconductor chips with one another.

The second semiconductor chip module may include at least two second semiconductor chips stacked in a face-up type into a step-like shape and having second bonding pads which are disposed on respective step surfaces; and second connection members electrically connecting a lowermost second semiconductor chip among the second semiconductor chips with the conductive connection member and electrically connecting the second semiconductor chips with one another.

The semiconductor package may further include an encapsulant formed to seal an upper surface of the substrate including the first and second semiconductor chip modules and the conductive connection member; and external connection terminals attached to a lower surface of the substrate.

In an embodiment of the present invention, a semiconductor package includes a substrate; and at least two package units stacked on the substrate, each package unit comprising a first semiconductor chip module; a conductive connection member attached to the first semiconductor chip module; and a second semiconductor chip module attached to the conductive connection member to define a zigzag arrangement together with the first semiconductor chip module.

The conductive connection member may include a conductive plate; connection members placed between the conductive plate and the first semiconductor chip module and electrically connecting them with each other; and a spacer member interposed between the conductive plate and the first semiconductor chip module.

The conductive plate may include a substrate or a tape having electrical connection patterns.

The first semiconductor chip module may include at least two first semiconductor chips stacked in a face-up type into a step-like shape and having first bonding pads which are disposed on respective step surfaces; and first connection members electrically connecting a lowermost first semiconductor chip among the first semiconductor chips with the substrate and electrically connecting the first semiconductor chips with one another.

The second semiconductor chip module may include at least two second semiconductor chips stacked in a face-up type into a step-like shape and having second bonding pads which are disposed on respective step surfaces; and second connection members electrically connecting a lowermost second semiconductor chip among the second semiconductor chips with the conductive connection member and electrically connecting the second semiconductor chips with one another.

The semiconductor package may further include an encapsulant formed to seal an upper surface of the substrate including the first and second semiconductor chip modules and the conductive connection member; and external connection terminals attached to a lower surface of the substrate.

DESCRIPTION OF SPECIFIC EMBODIMENTS

Hereafter, specific embodiments of the present invention will be described in detail with reference to the accompanying drawings.

Exemplary embodiments are described herein with reference to cross-sectional illustrations and plan illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 1:
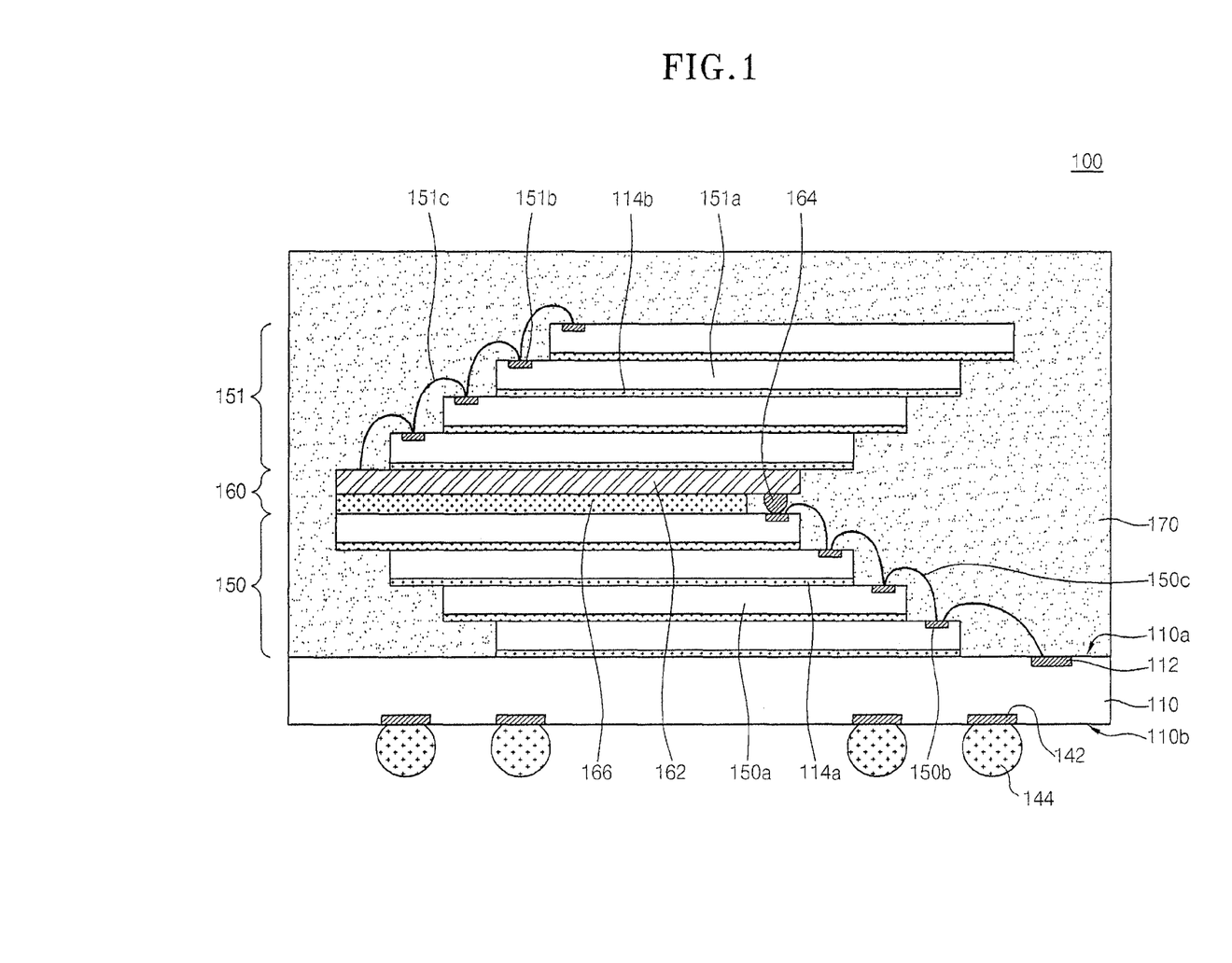
FIG. 1 is a cross-sectional view showing a semiconductor package in accordance with an embodiment of the present invention.
Figure 2:
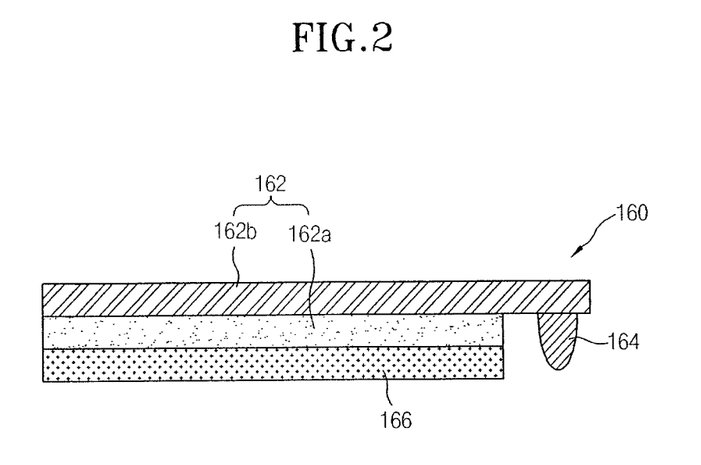
FIG. 2 is a cross-sectional view showing a conductive connection member shown in FIG. 1.
Figure 3:
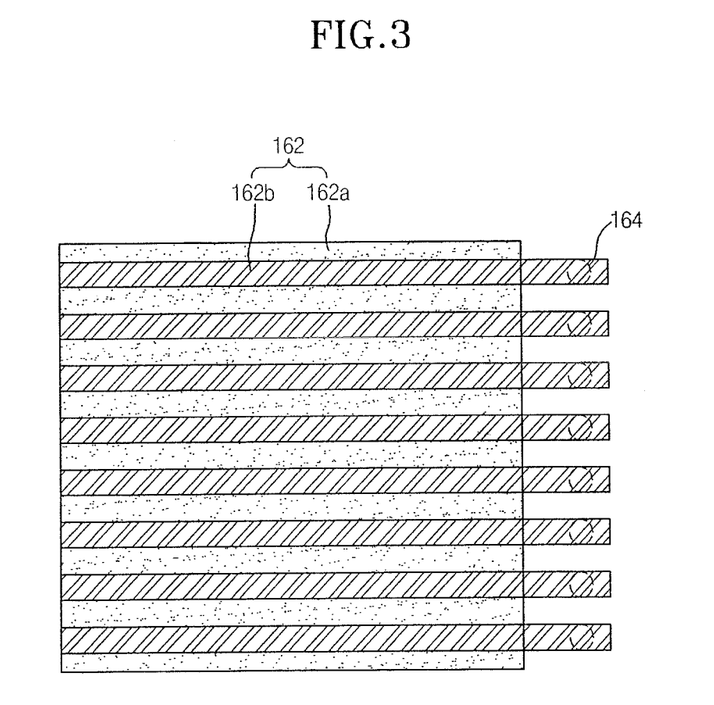
FIG. 3 is a plan view showing the conductive connection member shown in FIG. 2.

FIG. 1 is a cross-sectional view showing a semiconductor package in accordance with an embodiment of the present invention. FIG. 2 is a cross-sectional view showing a conductive connection member shown in FIG. 1. FIG. 3 is a plan view showing the to conductive connection member shown in FIG. 2.

Referring to FIG. 1, a semiconductor package 100 in accordance with an embodiment of the present invention includes a substrate 110, a first semiconductor chip module 150 which is attached onto the substrate 110, a conductive connection member 160, which is attached onto the first semiconductor chip module 150, and a second semiconductor chip module 151, which is attached onto the conductive connection member 160 in such a way as to define a zigzag arrangement together with the first semiconductor chip module 150. That is, the first semiconductor package 150 extends laterally as the first semiconductor package 150 extends vertically from the substrate 110, and the second package extends laterally in the opposite direction as the second semiconductor package 151 extends vertically from the conductive connection member 160. The semiconductor package 100 can further include an encapsulant 170 and external connection terminals 144.

The substrate 110 has bond fingers 112 which are formed along one edge of an upper surface 110a of the substrate 110, and circuit wiring lines (not shown) including ball lands 142, which are disposed on a lower surface 110b of the substrate 110, facing away from the upper surface 110a.

The first semiconductor chip module 150 includes at least two first semiconductor chips 150a stacked in a face-up configuration in a step-like shape. The first semiconductor chip module 150 further includes first bonding pads 150b disposed on respective step surfaces, and first connection members 150c which electrically connect the first bonding pads 150b of the first semiconductor chips 150a with one another, and electrically connect is the first bonding pads 150b of the lowermost first semiconductor chip 150a among the first semiconductor chips 150a with the bond fingers 112 of the substrate 110.

The first semiconductor chip module 150 can further include first adhesive members 114a which are interposed between the substrate 110 and the lowermost first semiconductor chip 150a and between adjoining first semiconductor chips 150a.

The second semiconductor chip module 151 includes at least two second semiconductor chips 151a which are stacked in a face-up configuration in a step-like shape. The second semiconductor chip module 151 further includes second bonding pads 151b disposed on respective step surfaces, and second connection members 151c, which electrically connect the second bonding pads 151b of the second semiconductor chips 151a with one another, and electrically connect the second bonding pads 151b of the lowermost second semiconductor chip 151a among the second semiconductor chips 151a with the conductive connection member 160. The first connection members 150c and the second connection members 151c can include, for example, metal wires.

The second semiconductor chip module 151 can further include second adhesive members 114b which are interposed between the conductive connection member 160 and the lowermost second semiconductor chip 151a and between adjoining second semiconductor chips 151a. In the second semiconductor chip module 151, which is attached onto the first semiconductor chip module 150 with the conductive connection member 160 interposed therebetween in such a way as to define the zigzag arrangement as described above. Further, the second bonding pads 151b of the second semiconductor chips 151a are disposed along edges of the second semiconductor chips 151a, and the first bonding pads 150b of the first semiconductor chips 150a are disposed along edges of the first semiconductor chips 150a, which are opposite the edges where the second bonding pages 151 are disposed.

The conductive connection member 160 includes a conductive plate 162, connection members 164, which are placed between the conductive plate 162 and the first semiconductor chip module 150 to electrically connect them with each other, and a spacer member 166 which is interposed between the conductive plate 162 and the first semiconductor chip module 150.

Referring to FIGS. 2 and 3, the conductive plate 162 can comprise a tape having electrical connection patterns. That is, the conductive plate 162 has a tape 162a with adhesion property and electrical connection patterns 162b which are disposed on the tape 162 to be separated from one another by a predetermined interval. The electrical connection patterns 162b can comprise a material having excellent electrical conductivity, for example, copper.

The spacer member 166 can have a rectangular shape when viewed from the top. The spacer member 166 ensures a space into which the connection members 164 placed between the conductive plate 162 and the first semiconductor chip module 150 can be inserted, and physically attaches the first semiconductor chip module 150 to the conductive plate 162. In the case where the spacer member 166 includes an adhesive tape, the tape 162a of the conductive plate 162 may or may not be formed.

As shown in FIG. 2, the electrical connection patterns 162b of the conductive plate 162 can have a length longer than the tape 162a and the spacer member 166. Due to this fact, the electrical connection patterns 162b project out of at least one end of the tape 162a and the spacer member 166.

Referring again to FIG. 1, the connection members 164 are placed in the space defined between the conductive plate 162 and the first bonding pads 150b of the uppermost first semiconductor chip 150a and electrically connect them with each other. The connection members 164 can include, for example, solders or bumps.

The conductive plate 162 may have the same length as the first and second semiconductor chips 150a and 151a. Alternatively, the conductive plate 162 may have a length different from that of the first and second semiconductor chips 150a and 151a.

The encapsulant 170 is formed to seal the upper surface 110a of the substrate 110 including the first and second semiconductor chip modules 150 and 151 and the conductive connection member 160 formed thereon. The encapsulant 170 can include, for example, an epoxy molding compound (EMC).

The external connection terminals 144 are attached to the ball lands 142, which are disposed on the lower surface 110b of the substrate 110. The external connection terminals 144 can include, for example, solder bails, bumps or the like.

In the semiconductor package in accordance with the embodiment of the present invention, due to the fact that upper and lower semiconductor chip modules are stacked to define a zigzag arrangement with a conductive connection member interposed therebetween, it is sufficient to conduct wire bonding with a mold margin on only one side. Accordingly, in the embodiment, the mold margin of an encapsulant for sealing the semiconductor chip modules and the conductive connection member can be significantly decreased, whereby a semiconductor package can be designed to have a decreased size.

Further, in the semiconductor package in accordance with an embodiment of the present invention, because the length of metal wires can be decreased through adoption of the conductive connection member, it is possible to substantially prevent the occurrence of a short circuit due to a sweeping phenomenon.

Moreover, in the semiconductor package in accordance with an embodiment of the present invention, since the conductive connection member functions to support semiconductor chips, the is stress applied to the semiconductor chips stacked on the conductive connection member can be reduced, whereby it is possible to substantially prevent cracks from occurring in the semiconductor chips.

Figure 4:
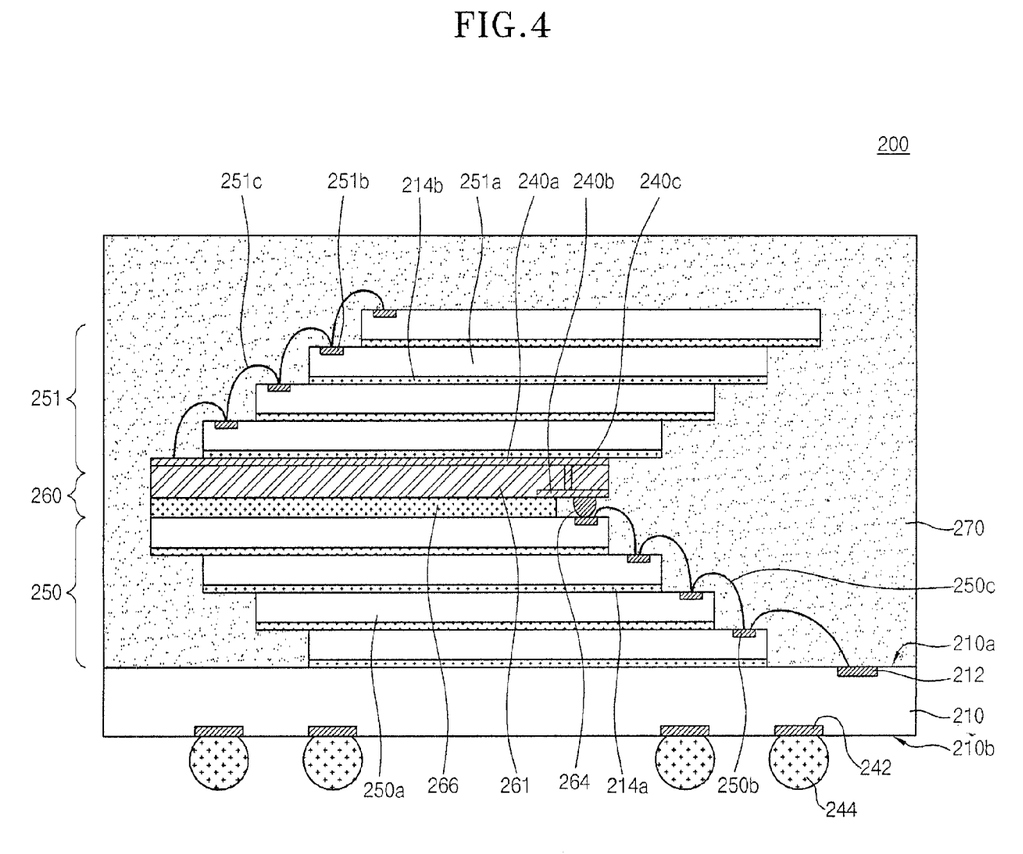
FIG. 4 is a cross-sectional view showing a semiconductor package in accordance with an embodiment of the present invention.
Figure 5:
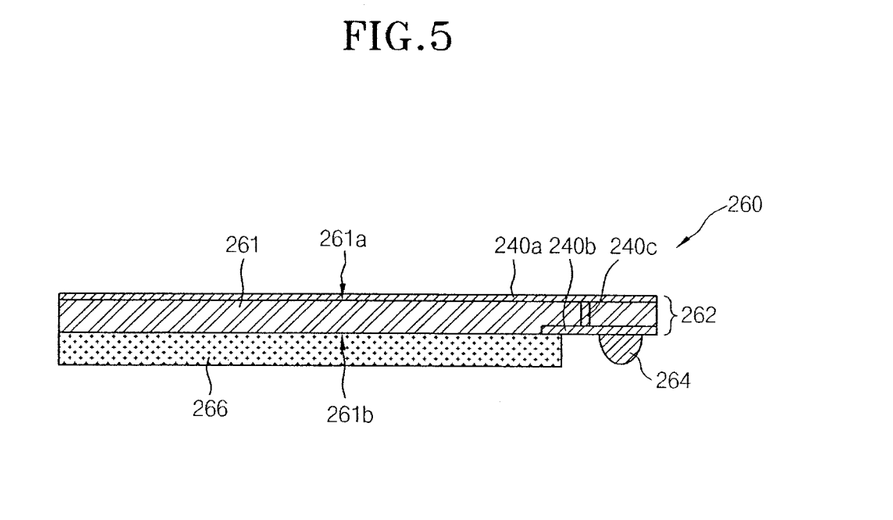
FIG. 5 is a cross-sectional view illustrating a conductive connection member shown in FIG. 4.

FIG. 4 is a cross-sectional view showing a semiconductor package in accordance with an embodiment of the present invention. FIG. 5 is a cross-sectional view showing a conductive connection member shown in FIG. 4.

Referring to FIGS. 4 and 5, a semiconductor package 200 in accordance with an embodiment of the present invention includes a substrate 210, a first semiconductor chip module 250, a conductive connection member 260, and a second semiconductor chip module 251.

The substrate 210, the first semiconductor chip module 250 and the second semiconductor chip module 251 according to another embodiment of the present invention are substantially the same as those of the aforementioned embodiment, and therefore, repeated descriptions will be omitted herein.

As shown in FIG. 5, according to an embodiment of the present invention, the conductive connection member 260 includes a conductive plate 262, connection members 264, and a spacer member 266.

The conductive plate 262 may include a substrate having electrical connection patterns. That is to say, the conductive plate is 262 has a conductive plate body 261 which has an upper surface 261a and a lower surface 261b facing away from the upper surface 261a, first connection patterns 240a disposed on the upper surface 261a of the conductive plate body 261, second connection patterns 240b disposed on the lower surface 261b of the conductive plate body 261, and via patterns 240c electrically connecting the first connection patterns 240a and the second connection patterns 240b.

The conductive plate body 261 can contain, for example, an insulation material. The via patterns 240c are formed to pass through portions of the upper surface 261a and the lower surface 261b of the conductive plate body 261, corresponding to the first connection patterns 240a and the second connection patterns 240b, and electrically connect the first and second connection patterns 240a and 240b.

The connection members 264 are placed in the space defined between the conductive plate 262 and the first bonding pads 250b of the uppermost first semiconductor chip 250a and electrically connect them with each other. The connection members 264 can include, for example, solders, bumps or the like.

The spacer member 266 can have a rectangular shape when viewed from the top. The spacer member 266 ensures a space into which the connection members 264 placed between the conductive plate 262 and the first semiconductor chip module 250 can be inserted, and physically attaches the first semiconductor is chip module 250 to the conductive plate 262.

Since the semiconductor package depicted in FIGS. 4-5 has substantially the same construction as the semiconductor package depicted in FIGS. 1-3, except the conductive connection member, repeated description will be omitted herein.

Figure 6:
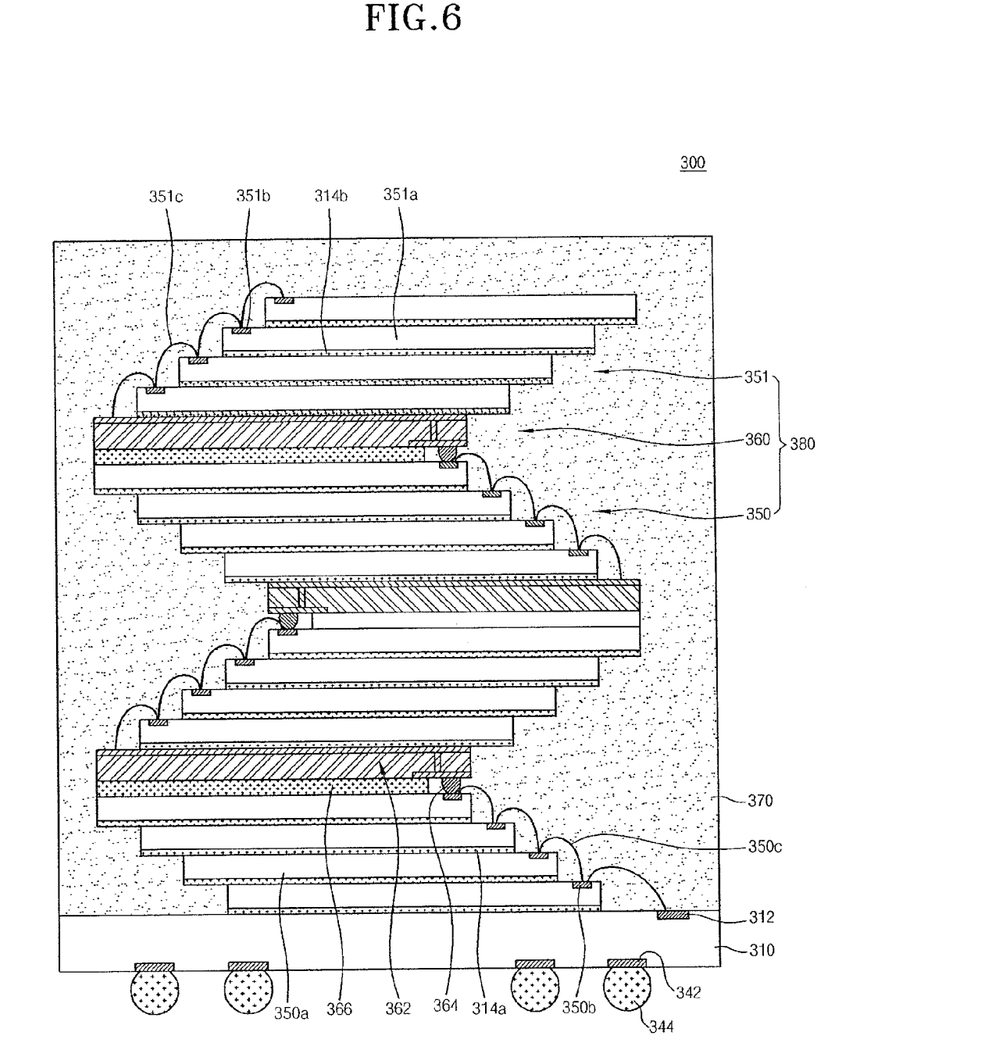
FIG. 6 is a cross-sectional view showing a semiconductor package in accordance with an embodiment of the present invention.

FIG. 6 is a cross-sectional view showing a semiconductor package in accordance with another embodiment of the present invention.

Referring to FIG. 6, a semiconductor package 300 in accordance with an embodiment of the present invention includes a substrate 310, and at least two package units 380 which are stacked on the substrate 310. The semiconductor package 300 can further include an encapsulant 370 and external connection terminals 344.

The substrate 310 has bond fingers 312 which are formed along one edge of an upper surface 310a of the substrate 310, and circuit wiring lines (not shown) including ball lands 342 which are disposed on a lower surface 310b of the substrate 310, facing away from the upper surface 310a.

Each package unit 380 includes a first semiconductor chip module 350, a conductive connection member 360 which is attached onto the first semiconductor chip module 350, and a second semiconductor chip module 351 which is attached onto the conductive connection member 360 in such a way as to define a is zigzag arrangement together with the first semiconductor chip module 350. That is, the first semiconductor package 350 extends laterally as the first semiconductor package 350 extends vertically from the substrate 310, and the second package extends laterally in the opposite direction as the second semiconductor package 351 extends vertically from the conductive connection member 360.

The first semiconductor chip module 350 includes at least two first semiconductor chips 350a which are stacked in a face-up configuration in a step-like shape and have first bonding pads 350b disposed on respective step surfaces, and first connection members 350c which electrically connect the first bonding pads 350b of the first semiconductor chips 350a with one another and electrically connect the first bonding pads 350b of the lowermost first semiconductor chip 350a among the first semiconductor chips 350a with the bond fingers 312 of the substrate 310 or a connection member 360 of a lower package unit 380 if the package unit 380 is not the lowest package unit 380.

The first semiconductor chip module 350 can further include first adhesive members 314a which are interposed between the substrate 310 and the lowermost first semiconductor chip 350a and between adjoining first semiconductor chips 350a.

The second semiconductor chip module 351 includes at least two first semiconductor chips 351a which are stacked in a face-up configuration in a step-like shape and have second bonding pads 351b disposed on respective step surfaces, and second connection members 351c which electrically connect the second bonding pads 351b of the second semiconductor chips 351a with one another and electrically connect the second bonding pads 351b of the lowermost second semiconductor chip 351a among the second semiconductor chips 351a with the conductive connection member 360. The first and second connection members 350c and 351c can include, for example, metal wires.

The second semiconductor chip module 351 can further include second adhesive members 314b which are interposed between the conductive connection member 360 and the lowermost second semiconductor chip 351a and between adjoining second semiconductor chips 351a.

The conductive connection member 360 includes a conductive plate 362, connection members 364 which are placed between the conductive plate 362 and the first semiconductor chip module 350 to electrically connect them with each other, and a spacer member 366 which is interposed between the conductive plate 362 and the first semiconductor chip module 350.

The conductive plate 162 can include, for example, a substrate or a tape having electrical connection patterns.

The connection members 364 are placed in the space defined between the conductive plate 362 and the first bonding pads 350b of the uppermost first semiconductor chip 350a and electrically connect them with each other. The connection members 364 can include, for example, solders, bumps, or the like.

The spacer member 366 ensures a space into which the connection members 364 placed between the conductive plate 362 and the first semiconductor chip module 350 can be inserted, and physically attaches the first semiconductor chip module 350 and the conductive plate 362.

The encapsulant 370 is formed to seal the upper surface 310a of the substrate 310 including the first and second semiconductor chip modules 350 and 351 and the conductive connection member 360 of each package unit 380. The encapsulant 370 can include, for example, an EMC (epoxy molding compound).

The external connection terminals 344 are attached to the ball lands 342 which are disposed on the lower surface 310b of the substrate 310. The external connection terminals 344 can include, for example, solder balls, bumps, or the like.

In the semiconductor package in accordance with an embodiment of the present invention, due to the fact that at least two package units are vertically stacked, even higher capacity can be realized.

Although specific embodiments of the present invention have been described for illustrative purposes, those skilled in the art will appreciate that various modifications, additions and substitutions are possible, without departing from the scope and the is spirit of the invention as disclosed in the accompanying claims.

The invention claimed is:

1. A semiconductor package comprising:
a substrate;
a first semiconductor chip module attached to the substrate;
a conductive connection member attached to the first semiconductor chip module, the conductive connection member comprising a conductive plate, a spacer member, and a connection member; and
a second semiconductor chip module attached to the conductive connection member,
wherein the first semiconductor chip module is disposed over the substrate,
the second semiconductor chip module is disposed over the first semiconductor chip module,
the conductive connection member is interposed between the first semiconductor chip module and the second semiconductor chip module, and
the conductive plate having a length longer than the spacer member and projecting out of at least one end of the spacer member.

2. The semiconductor package according to claim 1,
wherein the connection members is placed between the conductive plate and the first semiconductor chip module and electrically connecting the conductive plate with the first semiconductor chip module, and
wherein a spacer member is interposed between the conductive plate and the first semiconductor chip module.

3. The semiconductor package according to claim 1, wherein the conductive plate comprises a substrate having electrical connection patterns or a tape having electrical connection patterns.

4. The semiconductor package according to claim 3, wherein the substrate having electrical connection patterns comprises:
a conductive plate body which has an upper surface and a lower surface facing away from the upper surface;
first connection patterns disposed on the upper surface of the conductive plate body;
second connection patterns disposed on the lower surface of the conductive plate body; and
via patterns electrically connecting the first connection and the second connection patterns.

5. The semiconductor package according to claim 4, wherein the conductive plate body comprises an insulation material.

6. The semiconductor package according to claim 4, wherein the via patterns are formed to pass through portions of the upper surface and the lower surface of the conductive plate body.

7. The semiconductor package according to claim 1, wherein the first semiconductor chip module comprises:
   at least two first semiconductor chips stacked in a face-up configuration, the at least two first semiconductor chips being offset from each other in a step-like shape and having first bonding pads disposed on respective step surfaces; and
   first connection members electrically connecting the first semiconductor chips with one another and electrically connecting a lowermost first semiconductor chip among the first semiconductor chips with the substrate.

8. The semiconductor package according to claim 1, wherein the second semiconductor chip module comprises:
   at least two second semiconductor chips stacked in a face-up configuration, the at least two second semiconductor chips being offset from each other in a step-like shape and having second bonding pads disposed on respective step surfaces; and
   second connection members electrically connecting the second semiconductor chips with one another and electrically connecting a lowermost second semiconductor chip among the second semiconductor chips with the conductive connection member.

9. The semiconductor package according to claim 1, further comprising:
   an encapsulant formed to seal an upper surface of the substrate, the first and second semiconductor chip modules, and the conductive connection member; and
   external connection terminals attached to a lower surface of the substrate.

10. A semiconductor package comprising:
    a substrate; and
    at least two package units stacked on the substrate,
        each package unit comprising:
            a first semiconductor chip module;
            a conductive connection member attached to the first semiconductor chip module, the conductive connection member comprising a conductive plate, a spacer member, and a connection member; and
            a second semiconductor chip module attached to the conductive connection member,
        wherein the first semiconductor chip module is disposed over the substrate,
        the second semiconductor chip module is disposed over the first semiconductor chip module,
        the conductive connection member is interposed between the first semiconductor chip module and the second semiconductor chip module, and
        the conductive plate having a length longer than the spacer member and projecting out of at least one end of the spacer member.

11. The semiconductor package according to claim 10, wherein the connection member is placed between the conductive plate and the first semiconductor chip module and electrically connecting the conductive plate with the first semiconductor chip module; and
    wherein a spacer member is interposed between the conductive plate and the first semiconductor chip module.

12. The semiconductor package according to claim 11, wherein the conductive plate comprises a substrate having electrical connection patterns or a tape having electrical connection patterns.

13. The semiconductor package according to claim 12, wherein the substrate having electrical connection patterns comprises:
    a conductive plate body which has an upper surface and a lower surface facing away from the upper surface;
    first connection patterns disposed on the upper surface of the conductive plate body;
    second connection patterns disposed on the lower surface of the conductive plate body; and
    via patterns electrically connecting the first connection and the second connection patterns.

14. The semiconductor package according to claim 13, wherein the conductive plate body comprises an insulation material.

15. The semiconductor package according to claim 13, wherein the via patterns are formed to pass through portions of the upper surface and the lower surface of the conductive plate body.

16. The semiconductor package according to claim 10, wherein the first semiconductor chip module comprises:
    at least two first semiconductor chips stacked in a face-up configuration, the at least two first semiconductor chips being offset from each other in a step-like shape and having first bonding pads disposed on respective step surfaces; and
    first connection members electrically connecting the first semiconductor chips with one another, and electrically connecting a lowermost first semiconductor chip among the first semiconductor chips with the substrate when the package unit is the lower package unit among at least two package units.

17. The semiconductor package according to claim 10, wherein the second semiconductor chip module comprises:
    at least two second semiconductor chips stacked in a face-up configuration in a step-like shape and having second bonding pads disposed on respective step surfaces; and
    second connection members electrically connecting the second semiconductor chips with one another and electrically connecting a lowermost second semiconductor chip among the second semiconductor chips with the conductive connection member.

18. The semiconductor package according to claim 10, further comprising:
    an encapsulant formed to seal an upper surface of the substrate, the first and second semiconductor chip modules, and the conductive connection member; and
    external connection terminals attached to a lower surface of the substrate.

* * * * *